United States Patent [19]
Mohri

[11] Patent Number: 5,870,328
[45] Date of Patent: *Feb. 9, 1999

[54] BISTABLE MAGNETIC ELEMENT AND METHOD OF MANUFACTURING THE SAME

[75] Inventor: Kaneo Mohri, Nagoya, Japan

[73] Assignee: Research Development Corporation of Japan, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 709,907

[22] Filed: Sep. 9, 1996

[30] Foreign Application Priority Data

Sep. 14, 1995 [JP] Japan ................................. 7-236318

[51] Int. Cl.$^6$ .................................................. G11C 11/12
[52] U.S. Cl. ........................ 365/135; 365/136; 365/157; 335/296
[58] Field of Search ................... 335/296; 365/134–139, 365/157; 324/244, 260

[56] References Cited

U.S. PATENT DOCUMENTS

| | | |
|---|---|---|
| 3,173,131 | 3/1965 | Perucca .................................. 365/157 |
| 3,320,596 | 5/1967 | Smith, Jr. et al. ....................... 365/157 |
| 3,902,167 | 8/1975 | Lutes et al. ....................... 340/174 PW |
| 4,236,230 | 11/1980 | Thompson ............................... 365/157 |
| 4,451,876 | 5/1984 | Ogata ......................................... 363/21 |
| 4,913,750 | 4/1990 | Kakuno et al. .......................... 148/304 |
| 4,939,459 | 7/1990 | Akachi et al. ........................... 324/247 |

FOREIGN PATENT DOCUMENTS 406283344A 10/1994 Japan .

OTHER PUBLICATIONS

IEEE Transactions on Magnetics, vol. 31, No. 6, pp. 3167–3169.

*Primary Examiner*—Renee S. Luebke
*Assistant Examiner*—Raymond Barrera
*Attorney, Agent, or Firm*—Lorusso & Loud

[57] ABSTRACT

In a bistable magnetic element, a pulse current or a dc-biased high frequency current is supplied to a soft magnetic material which has a helical magnetic anisotropy. As a result, the magnitude of a voltage induced across the soft magnetic material abruptly changes with respect to variation in an external magnetic field.

5 Claims, 4 Drawing Sheets

FIG. 3(a) i(t) 
FIG. 3(b) V₀(t)① 
FIG. 3(c) V₀(t)② 
FIG. 4
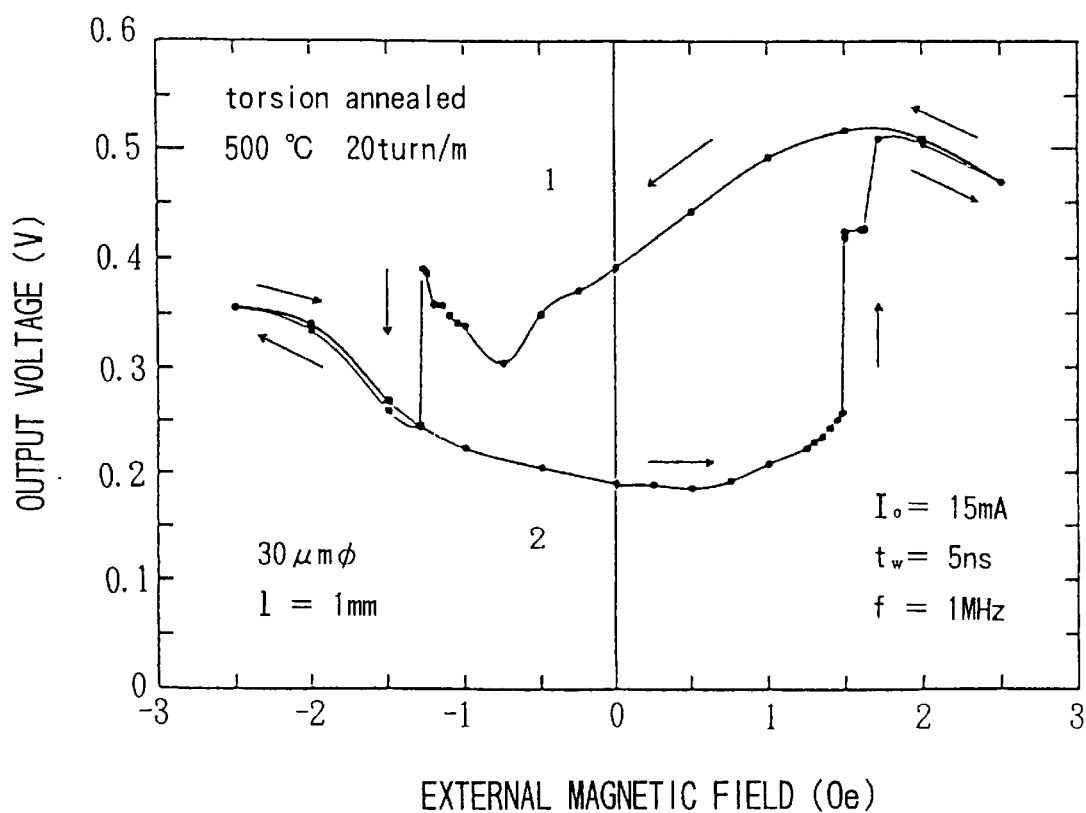

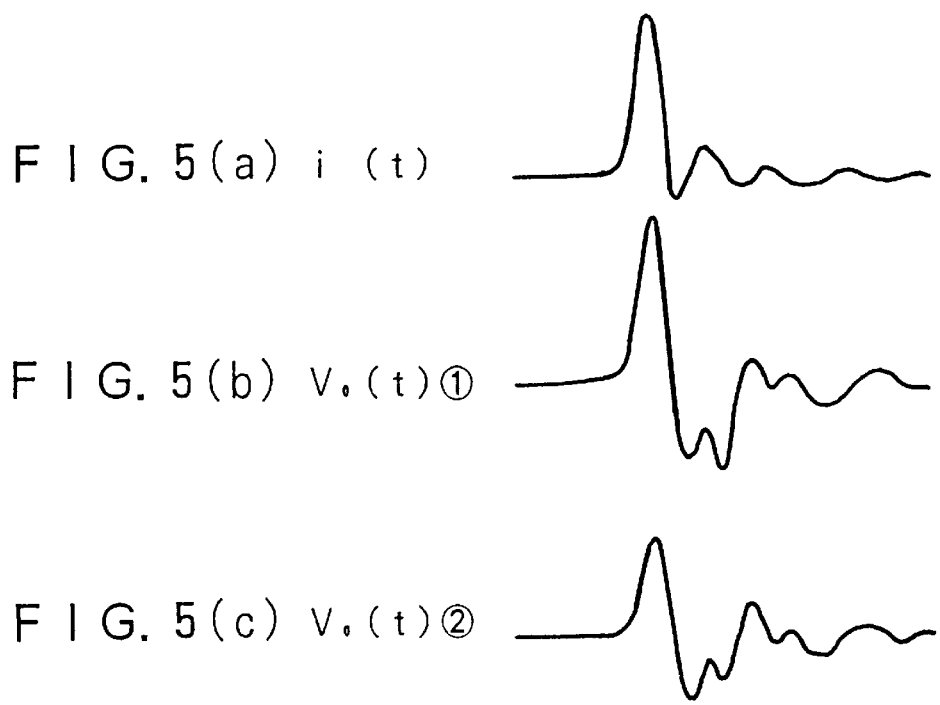
FIG. 5(a) i(t)
FIG. 5(b) V₀(t)①
FIG. 5(c) V₀(t)②
FIG. 6
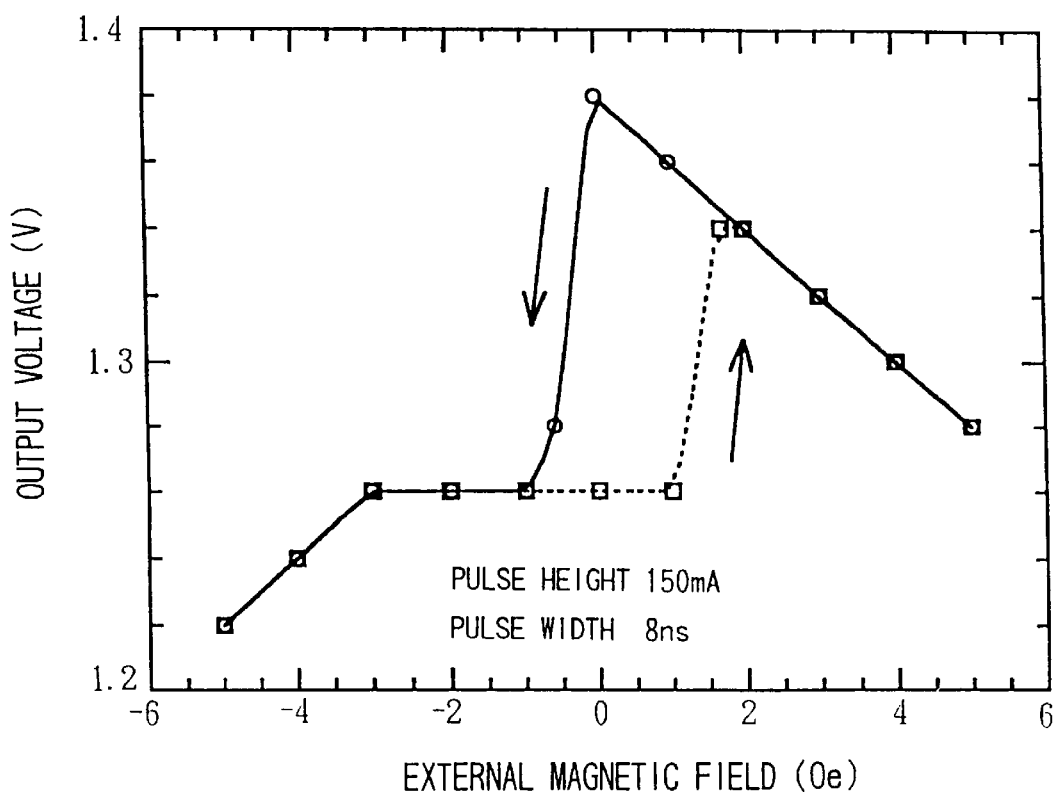
PULSE HEIGHT 150mA
PULSE WIDTH 8ns

BISTABLE MAGNETIC ELEMENT AND METHOD OF MANUFACTURING THE SAME

BACKGROUND OF THE INVENTION

1. Field of the Invention

The present invention relates to a bistable magnetic element which is compact and has high sensitivity and high response speed and a method of manufacturing such a bistable magnetic element. The bistable magnetic element of the present invention is suitable for use in magnetic sensor switches such as a proximity switch and a digital magnetic switch which are used in input devices for computers and information equipment and in equipment for factory automation (FA), and is also suitable for use in digital magnetic memory cells and the like for computers and information equipment which allow high speed read/write operation.

2. Description of the Related Art

With the progress of micro-nano electronic technology and multimedia technology, computers, portable information terminals, AV equipment, FA equipment, measuring/control equipment, etc., have been improved to reduce their sizes and improve their performances. Especially, in the field of computer-related equipment, such trend is remarkable. In magnetic recording devices, such as a hard disk and a floppy disk drive, which serve as external storage devices, it is also desired to realize a storage device which does not have any mechanical moving portion and which makes it possible to carry out read/write operation electronically. An example of such a storage device is an NDRO (non-destructive readout) magnetic memory card such as a magnetic flash memory card.

In order to meet the demand, micro-sized digital memory cell is necessary which has high sensitivity and high response speed and which has a simple shape and a desired sensor function. However, magnetic elements which satisfy the above-described requirements have not yet been developed.

In the past, a parametron element was used as a non-destructive magnetic memory. However, in such an element using a ferrite core, the rise time of parametric excitation upon reception of a trigger pulse is long (i.e., a few microseconds), and coils are required, which makes it difficult to fabricate the parametron element as a part of an integrated circuit. Accordingly, the parametron element is not used in these days.

After that, a twistor memory element in which electrically conductive permalloy foil is wound helically has been invented. Although the twistor memory element operates as a bistable magnetic memory, the manufacture thereof is troublesome, and it is necessary to supply a large current to the memory element. In addition, the twistor memory element is also difficult to fabricate as a part of an integrated circuit. Due to these drawbacks, the twistor memory element is not used in these days.

Meanwhile, a huge number of magnetic type proximity switches are used in keyboards and mice for computers and word processors, joy sticks for game machines, and proximity sensors for FA. However, a combination module of a Hall element or MR element and a hysteresis comparator used in the magnetic proximity switches requires a magnetic field of a few tens gausses or higher to operate, which means that the sensitivity of the module is low. Moreover, the temperature characteristics of the module is not stable.

A head including a fluxgate sensor can be used to obtain high sensitivity. However, due to demagnetizing fields, the size of the head cannot be reduced. Also, the response speed of the head is low because the head is excited by coil current.

SUMMARY OF THE INVENTION

An object of the present invention is to solve the above-mentioned problems and to provide a bistable magnetic element which is compact and which has high sensitivity and high response speed.

Another object of the present invention is to provide a method of manufacturing the bistable magnetic element as set forth above.

To achieve the above objects, the present invention provides a bistable magnetic element, in which a pulse current or a dc-biased high frequency current is supplied to a soft magnetic material having a helical magnetic anisotropy. As a result, the magnitude of a voltage induced across the soft magnetic material abruptly changes with a hysteresis with respect to variation in the external magnetic field.

Therefore, it is possible to reduce the size of the bistable magnetic element and to obtain large variations in the output voltage with respect to variations in external magnetic fields. Accordingly, it is possible to obtain a bistable magnetic element which has high sensitivity and high response speed.

Preferably, the soft magnetic material is an amorphous magnetic material.

Since the amorphous magnetic material has a high electrical resistivity, the impedance can be increased and the size of the bistable magnetic element can be decreased further. In addition, it is possible to obtain large voltage variations with respect to variations in external magnetic fields.

More preferably, the amorphous magnetic material is an amorphous wire.

In this case, the size of the bistable magnetic element can be decreased further to the order of less than one millimeter, and it is possible to obtain large voltage variations with respect to variations in external magnetic fields.

Alternatively, the soft magnetic material is a thin film.

In this case as well, the size of the bistable magnetic element can be decreased further to the order of less than one millimeter, and it is possible to obtain large voltage variations with respect to variations in external magnetic fields.

The present invention also provides a method of manufacturing a bistable magnetic element. This method includes the steps of drawing an elongated soft magnetic material having a magnetostriction as to obtain a thin wire; annealing the wire while applying a tension thereto; twisting the wire by a predetermined amount; and fixing both ends of the wire to electrodes.

As described above, a twist stress is applied to the wire so as to induce helical magnetic anisotropy utilizing the inverse magnetostrictive effect. Accordingly, it is possible to easily manufacture a bistable magnetic element which is compact and which has high sensitivity and high response speed.

In this case, the soft magnetic material wire is preferably an amorphous wire having a composition of FeCoSiB.

The present invention also provides a method of manufacturing a bistable magnetic element. This method includes the steps of drawing an elongated soft magnetic material having a magnetostriction as to obtain a thin wire; annealing the wire in a state in which the wire has been twisted by a predetermined amount; quenching the wire; and fixing both ends of the wire to electrodes.

As described above, the wire is heated and quenched in a state in which a twist stress has been applied to the wire so as to induce helical magnetic anisotropy. Accordingly, it is possible to easily manufacture a bistable magnetic element which is compact and which has high sensitivity and high response speed.

In this case, the soft magnetic material wire is preferably an amorphous wire having a composition of CoSiB.

The present invention also provides a method of manufacturing a bistable magnetic element. This method includes the steps of forming an elongated thin film of a soft magnetic material having zero magnetostriction; annealing the thin film in a state in which a circulating dc magnetic field and a longitudinal dc magnetic field are simultaneously applied to the thin film; and fixing both ends of the annealed thin film to electrodes.

As described above, helical magnetic anisotropy is induced by a so-called "orthogonal magnetic field annealing method" in which annealing is performed in a state in which a dc current (i.e., circulating dc magnetic field) and a longitudinal dc magnetic field are simultaneously applied to the thin film. Accordingly, it is possible to easily manufacture a bistable magnetic element which is compact and which has high sensitivity and high response speed.

In this case, an amorphous sputtered thin film having a composition of FeCoB is preferably used as the thin film of the soft magnetic material.

BRIEF DESCRIPTION OF THE DRAWINGS

FIGS. 3(a)–3(c) show the waveform of current supplied to the bistable magnetic element (amorphous wire) shown in FIG. 2 and the waveforms of the output voltage of the bistable magnetic element;

FIG. 4 is a graph showing the relationship between an external magnetic field applied to a bistable magnetic element (twisted amorphous wire) according to a second embodiment of the present invention and the output voltage of the bistable magnetic element;

FIGS. 5(a)–5(c) show the waveform of current supplied to the bistable magnetic element (twisted amorphous wire) shown in FIG. 4 and the waveforms of the output voltage of the bistable magnetic element;

FIG. 6 is a graph showing the relationship between an external magnetic field applied to a bistable magnetic element (amorphous sputtered thin film having no magnetostriction) according to a third embodiment of the present invention and the output voltage of the bistable magnetic element.

DESCRIPTION OF THE INVENTION AND PREFERRED EMBODIMENTS

The present invention provides a micro-sized bistable magnetic element which has high sensitivity and high response speed. The bistable magnetic element utilizes an elongated soft magnetic material having a high permeability in which helical magnetic anisotropy has been induced. An external magnetic field is applied to the magnetic material in the longitudinal direction thereof, so that bistable magnetic operation is caused by a jumping hysteresis phenomenon of the magnetization rotation. When a sharp pulse current or a dc-biased high frequency current is supplied to the magnetic material, a large voltage variation is induced between opposite ends of the magnetic material in accordance with the bistable magnetization due to high speed magnetization rotation.

Figure 1:
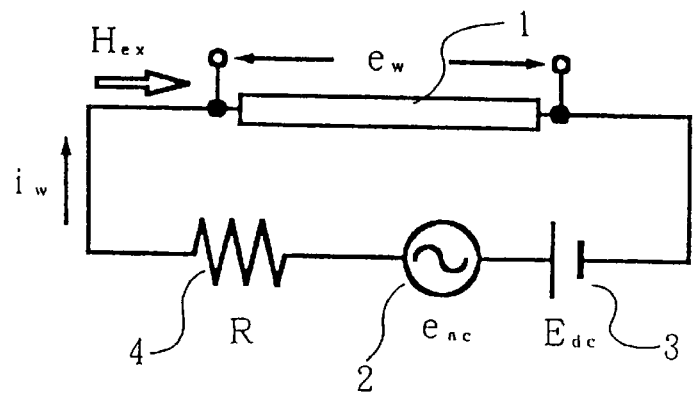
FIG. 1 is a circuit diagram showing the structure of a bistable magnetic element according to the present invention.

FIG. 1 is a circuit diagram showing the structure of a bistable magnetic element according to the present invention.

As shown in FIG. 1, a high frequency power supply ($e_{ac}$)2 and a direct current power supply ($E_{dc}$) (or a pulse generator) 3 are connected to a soft magnetic material (amorphous wire) 1 having helical magnetic anisotropy via a resistor (R) 4, thereby supplying to the soft magnetic material 1 a high frequency current on which a direct current or a pulse current is superposed. As a result, the magnitude of a voltage induced between both ends of the amorphous wire 1 jumps when an external magnetic field Hex reaches a certain level.

In the present invention, no limitation is imposed on the magnetic material, provided that it has helical magnetic anisotropy. However, when the magnetic material has an elongated shape, it is possible to reduce the size and to obtain increased variations in the output voltage. When an amorphous magnetic material is used, the impedance of the magnetic material can be increased because of its large electrical resistivity. This makes it possible to reduce the size further, and to obtain further increased variations in the output voltage.

To induce the helical magnetic anisotropy, one of the following methods is selectively used depending on the shape of the magnetic material. When a wire of a magnetic material is used, a twist stress is applied to the wire to utilize the inverse magnetostrictive effect, or a so-called "twist annealing method" is used in which heating and quenching are performed in a state in which a twist stress has been applied to the wire, thereby inducing the helical magnetic anisotropy.

When a thin film of a magnetic material is used, a so-called "transverse magnetic field annealing method" is used in which annealing is performed in a state in which a direct current (i.e., circulated dc magnetic field) and a dc magnetic field are simultaneously applied to the thin film in the longitudinal direction thereof.

In these methods, the helical anisotropy is induced only in the surface layer of the magnetic material. However, these inducing methods are sufficiently effective, because induction of a voltage depends only on the magnetic characteristic of the surface layer due to the skin effect of a pulse current or a high frequency current.

For example, the above-described bistable magnetic element is manufactured as follows. An amorphous wire (diameter: 30 $\mu$m, length: 1 mm, zero magnetostriction) is twisted, and both ends of the wire are soldered to electrodes. When a sharp pulse current having a pulse width of about 5 ns and a height of about 15 mA is supplied to the wire, the wire exhibits a clear bistable operation in response to application of magnetic fields of about ±1 gauss (or oersted) in the longitudinal direction of the wire. The magnitudes of the memory voltage pulses are about 200 mV and about 400 mV.

In the present invention, thin wire having a high permeability such as wire made of amorphous permalloy or wire of silicon steel may be used.

Two methods are generally used to realize a bistable element using a magnetic material. In the first method, flux reversal due to domain wall propagation is utilized. In the second method, flux reversal due to rotation of the magnetization vector is utilized.

Since flux reversal of a magnetic material generally occurs in a state in which both of domain wall displacement and magnetization rotation have occurred, the flux reversal exhibits a gently sloping BH hysteresis. In this case, a rectangular BH hysteresis or a reentrant (spool-shaped) BH hysteresis hardly occurs.

Accordingly, in order to obtain a bistable magnetic element, it is necessary to magnetize a magnetic material into a special state in which only domain wall displacement (domain propagation) or magnetization rotation with a proper initial angle occurs.

The inventors of the present invention found that in iron-base amorphous wire and silicon steel monocrystal wire, only domain wall propagation occurs. Amorphous wire is widely used in security sensor tags. In this domain wall propagation type bistable magnetic element, a sharp pulse (pulse width at the half amplitude: several micro seconds) is induced in a detection coil (in the case of a twisted wire, in the detection coil or between both ends of the wire) regardless of the excitation frequency (0.01–50 kHz) of an external magnetic field. However, in order to avoid the effect of the demagnetizing field, the bistable magnetic element must have a length corresponding to the length of the domain wall. In the case of a tension-annealed amorphous wire, the wire must have a length of 10 mm or greater after being drawn. In the case of an as-cast wire, the wire must have a length of 80 mm or greater after being drawn.

On the other hand, there has not been reported a case in which a bistable magnetic element is realized only by magnetization rotation. Since the threshold magnetic field (coercive force) of the domain wall displacement (in the case of a single magnetic domain structure, magnetic field generated by the magnetic domain) is generally smaller than the threshold magnetic field of the magnetization rotation, variations in the magnetic flux due to the domain wall displacement occur before the magnetization rotation occurs. Therefore, flux reversal due to the magnetization rotation cannot be measured. This is the reason why the bistable magnetic element realized only by magnetization rotation has not been reported.

Accordingly, in order to realize a bistable magnetic element utilizing magnetization rotation, (i) a state in which no domain wall displacement occurs must be realized, and (ii) the angle between a magnetization vector which causes magnetization rotation hysteresis and the vector of an external magnetic field must be set to a proper value (about 45°).

In the present invention, in view of the above-described principles, the following techniques are employed to provide a highly sensitive bistable magnetic element. That is, in order to meet the requirement (i), a high frequency current or a very sharp pulse current is applied to a magnetic material, so that domain walls are prevented from moving by a strong suppressing force generated by eddy current. In order to meet the requirement (ii), a twist stress is applied to the magnetic wire so as to induce helical magnetic anisotropy in the surface layer of the wire utilizing the reverse effect of the magnetostriction such that the helical magnetic anisotropy is induced with an angle of about ±45° with respect to the longitudinal axis of the wire. These techniques make it possible to provide a highly sensitive bistable magnetic element which has a very small length of about 1 mm, which has a considerably high response speed (several nano seconds), and which has a small threshold magnetic field of about 1 oersted (Oe).

The inventor of the present invention has already proposed a micro-sized magnetic sensor element (magneto-impedance (MI) element) (see Japanese Patent Application Laid-Open (kokai) No. 7-181239). In the MI element, a magnetic thin wire is driven by a high frequency current so as to utilize the skin effect. The MI element has high sensitivity and high response speed.

The inventors found that when helical magnetic anisotropy is added to the MI element functioning as an analog element and a sharp pulse current is supplied to the MI element, a remarkable bistable digital operation can be obtained. The bistable magnetic element of the present invention is based on this finding.

In a wire-shaped magnetic material, its twist stress becomes maximum at the surface thereof, so that the helical anisotropy is induced in the surface layer. On the other hand, since the magnetization in the circumferential direction due to the strong skin effect varies in the surface layer, only irreversible reversal of the magnetization vector appears effectively in the surface layer. In this case, such irreversible reversal of the magnetization vector occurs due to variations in external magnetic fields, and the application of a high frequency current or a sharp pulse current suppresses the movement of domain walls, so that a high voltage is generated between both ends of the wire.

Embodiments of the present invention will now be described with reference to the drawings.

Embodiment 1

Figure 2:
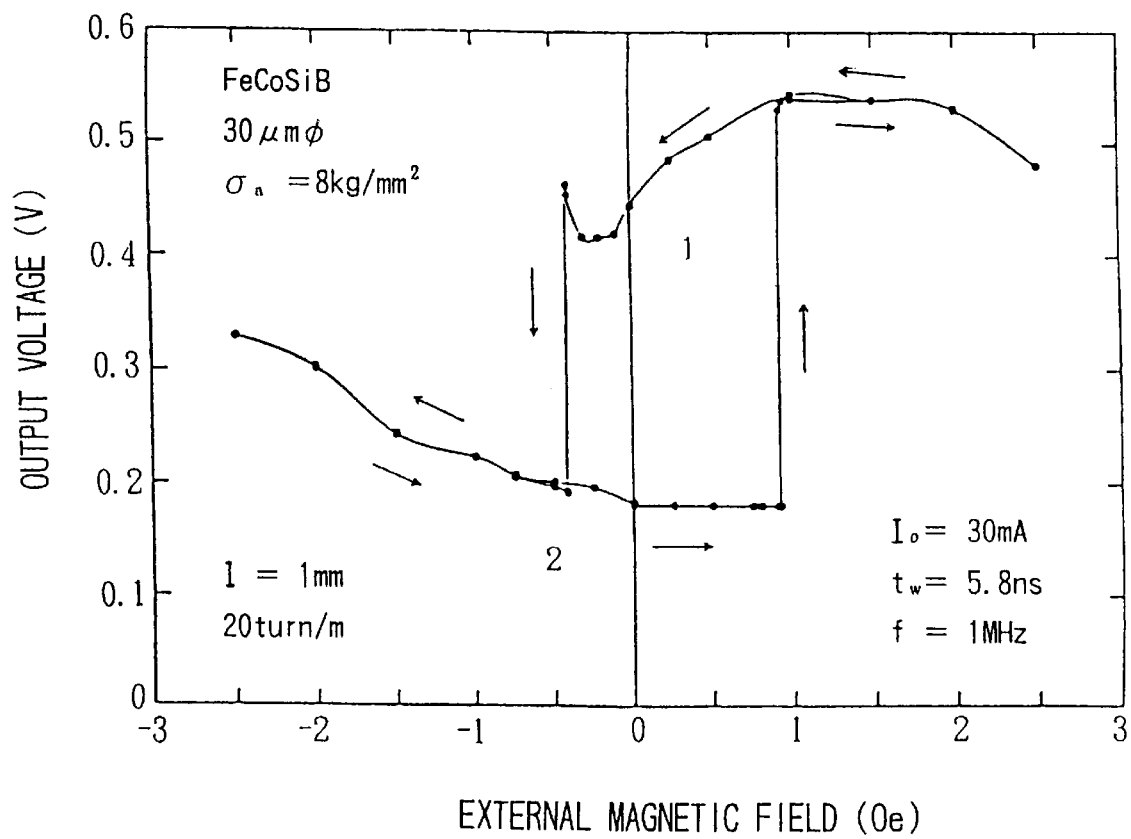
FIG. 2 is a graph showing the relationship between an external magnetic field applied to a bistable magnetic element (amorphous wire) according to a first embodiment of the present invention and the output voltage of the bistable magnetic element.

FIG. 2 is a graph showing the relationship between an external magnetic field (Oe) applied to a bistable magnetic element (amorphous wire) according to a first embodiment of the present invention and the output voltage (V) of the bistable magnetic element.

An amorphous wire ($Fe_{4.35}Co_{68.15}Si_{12.5}B_{15.0}$, Bs=0.7 T) having a slightly negative magnetostriction ($-10^{-7}$) was drawn such that the diameter became 30 $\mu$m, and was annealed (425° C., 20 minutes) while applying a tension of 8 kg/mm² to the wire. Subsequently, the amorphous wire was twisted 20 turns per meter. Both ends of the wire having a length of 1 mm were soldered to electrodes, thereby obtaining a sample. The bistable characteristic of the sample was measured. The results of the measurement are shown in FIG. 2.

FIGS. 3(a)–3(c) show the waveform of current supplied to the bistable magnetic element (amorphous wire) shown in FIG. 2 and the waveforms of the output voltage of the bistable magnetic element, wherein FIG. 3(a) shows the waveform of a pulse current supplied to the amorphous wire shown in FIG. 2, FIG. 3(b) shows the waveform of the output voltage of the amorphous wire shown in FIG. 2 for the storage level $\hat{1}$, and FIG. 3(c) shows the waveform of the output voltage of the amorphous wire shown in FIG. 2 for the storage level $\hat{2}$.

As shown in FIG. 2, when the external magnetic field ($H_{ex}$) is increased sufficiently in the negative range and then returned to zero, the magnitude of the induced output voltage $V_0$ becomes as low as about 0.18 V. When the external magnetic field ($H_{ex}$) is increased in the positive range and reaches 0.9 Oe, the output voltage $V_0$ jumps up to 0.53 V. When the external magnetic filed $H_{ex}$ is decreased to zero, the output voltage $V_0$ is maintained at 0.44 V, so that this state is stored. When the external magnetic field reaches −0.4 Oe, the output voltage $V_0$ jumps down. It is considered that the difference between the positive threshold and the negative threshold is caused by disturbance magnetic fields such as the terrestrial field (about 0.3 Oe), and the dc component of a circumferential magnetic field produced by the pulse current.

As is apparent from FIGS. 2 and 3, the bistable magnetic element of the present invention can be used as a proximity switch which has high sensitivity and high response speed, and as an NDRO high speed magnetic digital memory element. Since conventional proximity switches for FA are very large (length: about 30 mm, width: about 10 mm, thickness: about 3 mm), they cannot be used in certain technical fields, such as the field of semiconductor manufacturing apparatus, which require small proximity switches. The bistable magnetic element of the present invention can be used, as micro proximity switches, in such technical fields.

Embodiment 2

Next, a second embodiment of the present invention will be described.

FIG. 4 is a graph showing the relationship between an external magnetic field (Oe) applied to a bistable magnetic element (twisted amorphous wire) according to a second embodiment of the present invention and the output voltage (V) of the bistable magnetic element.

The amorphous wire of the first embodiment shown in FIG. 2 was twisted 20 turns per meter, and the twisted wire was then heated at 500° C. for 20 minutes in the air in a furnace.

The amorphous wire was then quenched in the air outside the furnace. Both ends of the quenched wire having a length of 1 mm were soldered to electrodes, thereby obtaining a sample. This sample was subjected to the same experiment as that in the first embodiment.

FIGS. 5(a)–5(c) show the waveform of current supplied to the bistable magnetic element (amorphous wire) shown in FIG. 4 and the waveforms of the output voltage of the bistable magnetic element. That is, FIG. 5(a) shows the waveform of a sharp pulse current (rising time: 3.5 ns, fall time: 3.2 ns, half-value width: 5.8 ns, height: 30 mA) which was supplied to the amorphous wire shown in FIG. 4. FIG. 5(b) shows the waveform of the output voltage of the amorphous wire shown in FIG. 4 for the storage level $\hat{1}$, and FIG. 5(c) shows the waveform of the output voltage of the amorphous wire shown in FIG. 4 for the storage level $\hat{2}$.

The magnetic field was slightly larger than that in the first embodiment, i.e., about 1.2 Oe.

In this case as well, the voltage levels for storing the pulse voltage were about 200 mV and about 400 mV.

As is apparent from the above, when an amorphous wire having a residual twist stress is used, the electrodes of the element can be formed easily.

Embodiment 3

Next, a third embodiment of the present invention will be described.

FIG. 6 is a graph showing the relationship between an external magnetic field (Oe) applied to a bistable magnetic element (amorphous sputtered thin film having no magnetostriction) according to a third embodiment of the present invention and the output voltage (V) of the bistable magnetic element.

50 mA of a dc current (circulated surface magnetic field: about 2 Oe) and about 1 Oe of a longitudinal dc magnetic field are applied to an FeCoB amorphous sputtered thin film having zero magnetostriction (thickness: 4 μm, width: 0.3 mm, length: 10 mm, substrate: glass). In this state, the thin film was annealed in the air at 250° C. for 20 minutes. A pulse current having a width of 8 ns and a height of 150 mA was supplied to the sample. FIG. 6 shows the relationship between the external magnetic field and the output voltage produced between both ends of the wire.

In the bistable magnetic element of the present embodiment, the amount of jumping and the variation rate are smaller than that those of the amorphous wires of the first and second embodiments. However, it is possible to obtain a binary-value memory phenomenon after the application of the external magnetic field.

Embodiment 4

Next, a fourth embodiment of the present invention will be described.

An amorphous wire $(Co_{72.5}Si_{12.5}B_{15.0})$ of 30 μmφ (annealed at 475° C. for one minute with a tension of 2 kg/mm²) was twisted, and both ends of the wire were soldered to electrodes. The wire has a length of 0.5 mm. A sharp pulse current (magnitude: 5 mA, frequency: 1 MHz, pulse width: 30 ns) was directly applied to the wire so as to excite it. A dc external magnetic field $H_{ax}$ was applied and the pulse-shape output voltage $V_0$ produced between both ends of the sample was measured.

Figure 7:
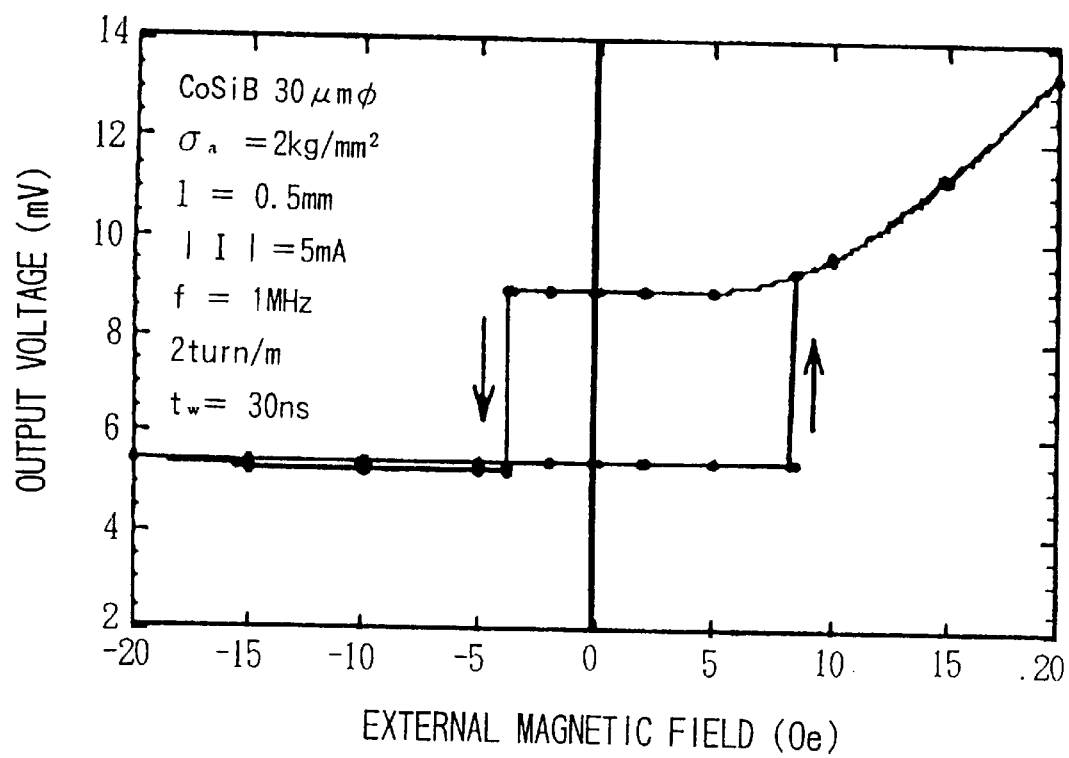
FIG. 7 is a graph showing the relationship between an external magnetic field applied to a bistable magnetic element (wire having CoSiB composition) according to a fourth embodiment of the present invention and the output voltage of the bistable magnetic element.

FIG. 7 is a graph showing the relationship between an external magnetic field (Oe) applied to a bistable magnetic element according to a fourth embodiment of the present invention and the output voltage (mV) of the bistable magnetic element. FIG. 7 shows a bistable characteristic for the case where the amount of twist was two turns. The magnitude of the external magnetic field at which the output voltage jumped increased to 8 Oe in the positive range, and to 4 Oe in the negative range.

In the FeCoSiB amorphous wires shown in the first through third embodiments, the magnitude of the external magnetic field at which the output voltage jumped was about 1 Oe, and the pulse width had to be reduced. In the CoSiB amorphous wire of the fourth embodiment, the effect of the disturbance magnetic fields such as the terrestrial field can be reduced.

The reason why the bistable characteristics is exhibited is considered that a large Barkhausen effect occurs in the surface portion of the wire. When the direction of an external magnetic field $H_{ex}$ is close to the direction of the magnetic vector which is inclined at an angle of 45° due to the twist stress, the excitation by the pulse current easily rotates the magnetization vector, so that a high voltage is produced. When the angle between the external magnetic field Hex and the magnetization vector is equal to or greater than 90°, it becomes difficult to rotate the magnetization vector, so that a low voltage is produced.

As described above, the present invention provides the following effects.

A micro-sized bistable magnetic element which has high sensitivity and high response speed can be obtained by applying helical magnetic anistropy to an amorphous wire or the like and by exciting it using a pulse current or a dc-biased high frequency current.

Moreover, by using this bistable magnetic element, a highly sensitive small-sized proximity switch and an NDRO digital magnetic recording element can be formed. This makes it possible to constitute a magnetic recording apparatus which can perform read/write operation electronically.

The present invention is not limited to the above-described embodiments. Numerous modifications and variations of the present invention are possible in light of the spirit of the present invention, and they are not excluded from the scope of the present invention.

What is claimed is:

1. A bistable magnetic system comprising; a first means for providing an electrical pulse or a DC-biased high frequency current;

second means for providing a varying external magnetic field; and an unlayered member of a uniform composition of a soft magnetic material with a helical magnetic anisotropy and having endpoints through which said member is supplied by said first means with an electrical pulse of a DC-biased high frequency current for prevention of domain wall displacement and so that a voltage induced across said soft magnetic material in response to a variation of an external magnetic field applied by said second means to said member changes abruptly.

2. A bistable magnetic element according to claim 1, wherein said soft magnetic material is an amorphous magnetic material.

3. A bistable magnetic element according to claim 2, wherein said member is a wire.

4. A bistable magnetic element according to claim 1, wherein said member is a thin film of an amorphous magnetic material.

5. A bistable magnetic element according to claim 1, wherein said member is a twisted drawn wire of amorphous magnetic material.

* * * * *